(12) United States Patent
Kim et al.

(10) Patent No.: US 7,573,412 B2
(45) Date of Patent: Aug. 11, 2009

(54) DIGITAL-TO-ANALOG CONVERTER (DAC)

(75) Inventors: Seung-woo Kim, Hwaseong-si (KR); Jae-sup Lee, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 12/043,793

(22) Filed: Mar. 6, 2008

(65) Prior Publication Data

US 2009/0079610 A1  Mar. 26, 2009

(30) Foreign Application Priority Data

Sep. 20, 2007  (KR) .................. 10-2007-0095901

(51) Int. Cl.
*H03M 1/66* (2006.01)
(52) U.S. Cl. .............. 341/149; 341/144; 341/136
(58) Field of Classification Search ........... 341/144, 341/149, 136
See application file for complete search history.

(56) References Cited

U.S. PATENT DOCUMENTS

| | | | |
|---|---|---|---|
| 3,092,735 A * | 6/1963 | Ricketts, Jr. ............... 327/412 |
| 3,401,386 A * | 9/1968 | Yanishevsky ............... 341/144 |
| 3,426,345 A | 2/1969 | Kase ........................... 341/149 |
| 3,825,925 A * | 7/1974 | Drusch ....................... 341/149 |
| 3,898,568 A * | 8/1975 | Barth ......................... 327/107 |
| 4,121,205 A * | 10/1978 | Iga et al. .................... 341/136 |
| 4,678,986 A * | 7/1987 | Barthelemy ................ 323/343 |
| 5,703,585 A | 12/1997 | Lamm |
| 6,252,532 B1 * | 6/2001 | Fawal et al. ................ 341/144 |
| 6,537,216 B1 * | 3/2003 | Shifrin ........................ 600/437 |
| 6,608,581 B1 | 8/2003 | Semenov |
| 7,205,913 B2 * | 4/2007 | Adams et al. ................ 341/60 |

* cited by examiner

*Primary Examiner*—Linh V Nguyen
(74) *Attorney, Agent, or Firm*—McNeely Bodendorf LLP

(57) ABSTRACT

A digital to analog converter (DAC) is provided. The DAC includes a first loop unit to receive a plurality of sources and comprising a plurality of primary winding of transistors formed at a plurality of locations, and a second loop unit comprising secondary windings to correspond to the primary windings, to receive the plurality of sources through the first loop unit, and combine the plurality of sources and output the result. Accordingly, a DAC is capable of directly converting a digital signal into an RF analog signal.

3 Claims, 2 Drawing Sheets

DIGITAL-TO-ANALOG CONVERTER (DAC)

CROSS-REFERENCE TO RELATED APPLICATIONS

This application claims the benefit under 35 U.S.C. § 119 (a) of Korean Patent Application No. 2007-0095901, filed Sep. 20, 2007, in the Korean Intellectual Property Office, the entire disclosure of which is hereby incorporated in its entirety by reference.

TECHNICAL FIELD

The following description relates to digital-to-analog converter (DAC) More particularly, the description relates to digital-to-analog converter (DAC) to directly convert a digital signal into a radio frequency (RF) analog signal.

BACKGROUND

Contrary to an analog-to-digital conversion (ADC), a digital-to-analog conversion (DAC) refers to a processing or device to convert a digital signal having a relatively fewer digits, i.e., generally less than two digits, into an analog signal that can theoretically have an infinite number of digits.

An example of the DAC includes a processing by a modem. In order to convert computer data into audio frequency tone suitable for transmission along a telephone line, a modem employs a DAC circuit.

FIG. 1 is a circuit diagram illustrating a part of a conventional DAC structure.

Specifically, FIG. 1 illustrates a part of a DAC for electric current adjustment having an improved dynamic performance disclosed in U.S. Pat. No. 6,927,714. A digital signal is converted into an analog signal as a plurality of switches $b_{N-1}$, $b_{N-2}$, ... $b_0$ combine electric currents and output the result.

The DAC having the improved dynamic performance in FIG. 1 adopts a mathematical formula:

$$\frac{\Delta I_D}{I_D} = \frac{1}{1+g_m R_s}\left[\frac{\Delta(\mu C_{ox})}{\mu C_{ox}} + \frac{\Delta W}{W} - \frac{\Delta L}{L} - \frac{2\Delta V_{TH}}{V_{GS} - V_{TH}} - g_m \Delta R_s\right]$$

As it is inferred from the above mathematical formula, a conventional DAC has an electric current mismatch of various parameters such as width (W) and length (L) of a transistor, $g_m$, $V_{TH}$, $C_{ox}$, or $R_s$.

As a result, a conventional DAC generally has a limited linearity and speed, and is capable of converting only in a relatively low frequency band.

SUMMARY

The method and device of digital-to-analog converter (DAC) for converting digital signal into a radio frequency (RF) analog signal, and having a function of a power amplifier.

In one general aspect, a method of converting digital signal into a radio frequency (RF) analog signal includes: a first loop unit to receive a plurality of sources and comprising a plurality of primary winding of transistors formed at a plurality of locations, and a second loop unit comprising secondary windings to correspond to the primary windings, to receive the plurality of sources through the first loop unit, and combine the plurality of sources and output the result.

The plurality of sources may include at least one of electric current, voltage, and power.

The first loop unit may include a plurality of transistors to receive the plurality of sources and a plurality of sub-loop units constructed by the primary windings formed on a first side of the first loop unit, and a pair of transistors formed on a second side of the first loop unit.

In another general aspect, a method of controlling input signal includes; a first loop unit to receive a plurality of sources and comprising a plurality of primary winding of transistors formed at a plurality of locations and a second loop unit comprising secondary windings to correspond to the primary windings, to receive the plurality of sources through the first loop unit, and combine the plurality of sources and output the result, and a control signal feed unit (300) to control the operation of the plurality of transistors by providing various types of sources. Almost all types of sources are applicable irrespective of electric current, voltage and power.

The plurality of sources may be input to the plurality of transistors in identical pattern if the control signal is supplied in a thermometer code manner, while the plurality of sources are input in different patterns for each of the transistors if the control signal is supplied in a multi-bits code manner.

Other features will become apparent to those skilled in the art from the following detailed description, which, taken in conjunction with the attached drawing, discloses exemplary embodiments of the invention.

DETAILED DESCRIPTION

The following detailed description is provided to assist the reader in gaining a comprehensive understanding of the methods and devices described herein. Accordingly, various changes, modifications, and equivalents of the systems and methods described herein will be suggested to those of ordinary skill in the art. Also, description of well-known functions and constructions are omitted to increase clarity and conciseness.

Figure 1:
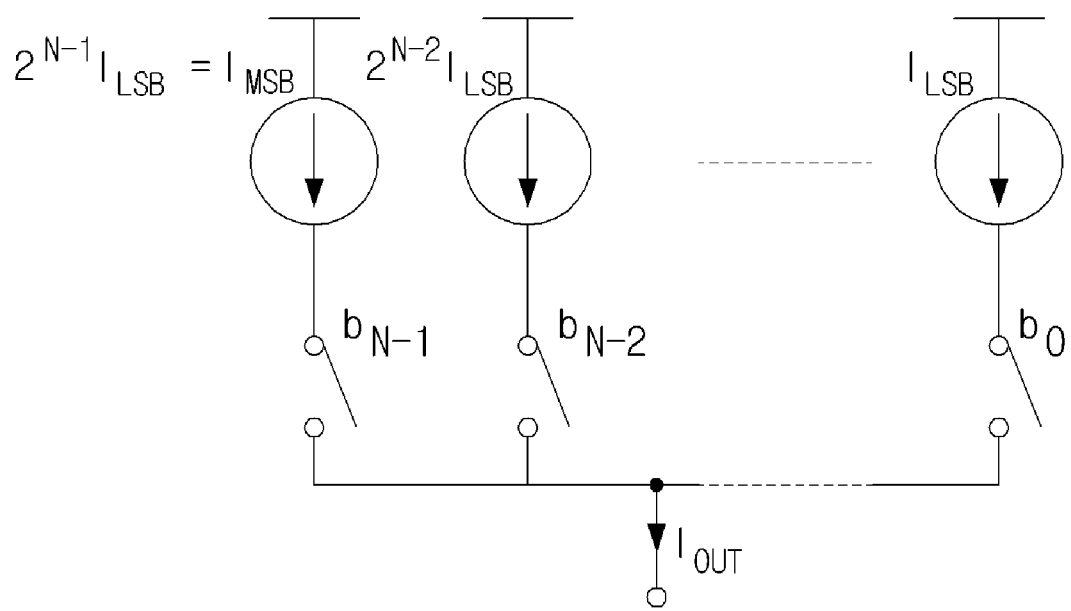
FIG. 1 is a circuit diagram of a part of a conventional digital-to-analog converter (DAC)
Figure 2:
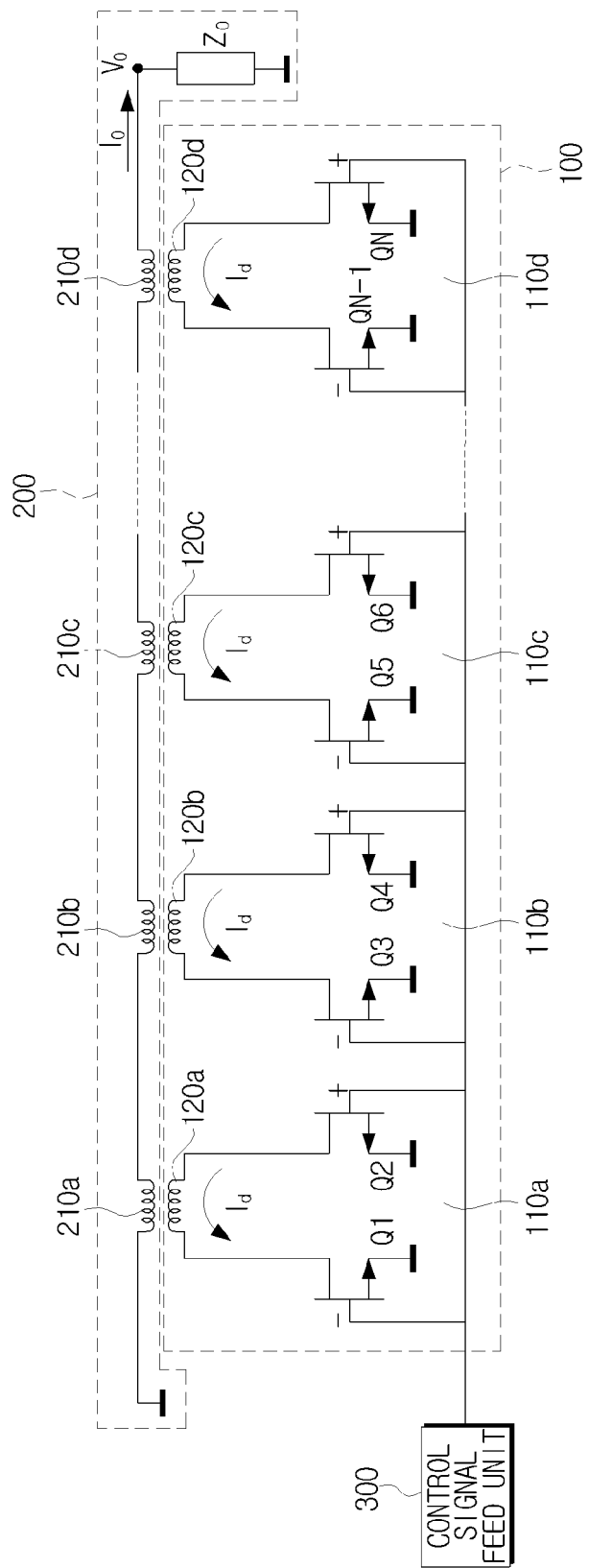
FIG. 2 is a circuit diagram of a digital-to-analog converter (DAC) illustrating an exemplary device for converting digital signal into a radio frequency (RF) analog signal. Throughout the drawings and the detailed description, the same drawing reference numerals will be understood to refer to the same elements, features, and structures.

FIG. 2 is a circuit diagram of a digital-to-analog converter (DAC)) illustrating an exemplary device for converting digital signal into a radio frequency (RF) analog signal.

Referring to FIG. 2, a digital-to-analog converter (DAC) includes a first loop unit 100, a second loop unit 200, and a control signal feed unit 300.

The first loop unit 100 receives a plurality of sources through a plurality of transistors (Q1 to QN). The plurality of sources may include one of a current, voltage, and power. The DAC according to the present general inventive concept is capable of converting a digital signal into an analog signal, regardless of the type of the source.

The first loop unit 100 includes a plurality of sub-loop units 110a, 110b, 110c, 110d having primary windings 120a, 120b, 120c, 120d of a transformer formed on a first side, and a plurality of pairs of transistors Q1 and Q2, Q3 and Q4, Q5 and Q6, and QN−1 and QN formed on a second side and connected with the primary windings 120a, 120b, 120c, 120d.

The number of sub-loop units 110a, 110b, 110c, and 110d corresponds to the number of transformer arranged in the DAC. The electric current $I_d$ flows the sub-loop units 110a, 110b, 110c, 110d in the pattern as indicated by the arrowed curves of FIG. 2. The pairs of transistors Q1 and Q2, Q3 and Q4, Q5 and Q6, and QN−1 and QN formed on the second side of the sub-loop units 110a, 110b, 110c, and 110d construct push-pull pairs.

Accordingly, due to the push-pull pairs formed by the pairs of transistors Q1 and Q2, Q3 and Q4, Q5 and Q6, and QN−1 and QN of the sub-loop units 110a, 110b, 110c, and 110d, the pairs of the transistors Q1 and Q2, Q3 and Q4, Q5 and Q6, and QN−1 and QN are capable of supplying the source to the primary windings 120a, 120b, 120c, and 120d of the transformer alternately.

The second loop unit 200 couples a plurality of sources input through the first loop unit 110 and outputs the result. Specifically, the sources are supplied to the DAC through the first loop unit 100, and the first loop unit 100 transmits the received sources to the second loop unit 200. The second loop unit 200 to receive the plurality of sources through the first loop unit, and generate output from the combined results of the plurality of sources which were received from the first loop unit 100. As a result, a digital signal is converted into an analog signal.

The electric current $I_o$ flows the second loop unit 200 towards the output in the pattern as indicated by the linear arrows of FIG. 2. Herein, the output voltage is $V_o$, and the output impedance is $Z_o$. The output signal at the output of the second loop unit 200 forms a stepwise pattern.

The second loop unit 200 includes secondary windings 210a, 210b, 210c, and 210d of a plurality of transformers. The secondary windings 210a, 210b, 210c, 210d are formed at locations to correspond to the primary windings 120a, 120b, 120c, and 120d of the transformers formed in the first loop unit 100.

As explained above, the transformers are formed in the first and second loop units 100 and 200 so that the magnetic coupling is formed between the first and second loop units 100 and 200. In other words, the DAC forms the transformers at a plurality of locations where the magnetic coupling between the first and second loop units 100 and 200 is formed.

The transformers have a frequency characteristic that has an operating range between several MHz to several tens of GHz. Because the plurality of transformers are formed based on the magnetic coupling, the DAC according to the present invention operates according to the frequency characteristic of the transformers, and thus has no limited speed.

Referring to FIG. 2, the DAC has a plurality of transformers formed across the first and second loop units 100 and 200. The DAC has the structure to receive a source through a plurality of transistors Q1 to QN. Accordingly, a distributed active transformer (DAT) structure is implemented, and this DAT structure can also achieve the function of a power amplifier (PA). In other words, the DAC according to an exemplary embodiment of the present invention not only converts a digital signal into an analog signal, but also functions as a power amplifier.

The control signal feed unit 300 supplies a control signal to control the operation of a plurality of transistors Q1 to QN formed in the first loop unit 100. By the control operation of the plurality of transistors Q1 to QN through the control signal feed unit 300, a stepwise output signal is output from the output end.

A control signal of the feed unit 300 may implement one of a thermometer code and a multi-bits code.

If the control signal feed unit 300 implements a thermometer code, a plurality of sources are input through the plurality of transistors Q1 to QN in identical pattern. For example, an electric source I can be supplied through the plurality of transistors Q1 to QN.

If the control signal feed unit 300 implements a multi-bits code, a plurality of sources are input through the plurality of transistors Q1 to QN in different patterns. Specifically, different types of sources are input to the pairs of transistors Q1 and Q2, Q3 and Q4, Q5 and Q6, and QN−1 and QN. For example, an electric current I may be supplied to Q1 and Q2, an electric source 2I may be supplied to Q3 and Q4, and an electric source 4I may be supplied to Q5 and Q6.

As explained above, the types of sources differ according to the code method adopted by the control signal feed unit 300. Almost all types of sources are applicable irrespective of electric current, voltage and power.

If the control signal feed unit 300 supplies a multi-bit code type control signal, an N-bit may be achieved by using N number of sources. If a thermometer code type control signal is supplied from the control signal feed unit 300, a logN/log2-bit may be achieved by using N number of sources.

Different bits are achieved according to the types of input sources. The bits are achieved by using N number of sources, and this applies universally irrespective of the types of input sources such as electric current, voltage, and power.

According to the DAC of the exemplary embodiments of the present invention, input signals are coupled by the magnetic coupling and output. As a result, different types of input sources such as electric current, power or power can be input and thus there is no limit imposed by the types of input sources.

Furthermore, because a transformer is implemented, having various frequency characteristics ranging from several MHz to tens of GHz, the DAC has not limited speed, and is capable of directly converting a digital signal into an RF analog signal.

Furthermore, the DAC not only converts a digital signal into an analog signal, but also functions as a power amplifier.

A number of exemplary embodiments have been described above. Nevertheless, it will be understood that various modifications maybe made. For example, suitable results maybe achieved if the described techniques are performed in a different order and/or if components in a described system, architecture, device, or circuit are combined in a different manner and/or replaced or supplemented by other components or their equivalents. Accordingly, other implementations are within the scope of the following claims.

What is claimed is:

1. A digital to analog converter (DAC) comprising:
    a first loop unit which includes a plurality of primary winding of transistors to receive a plurality of sources, wherein the first loop unit comprises a plurality of transistors to receive the plurality of sources;
    a second loop unit which includes secondary windings to correspond to the primary windings, to receive the plurality of sources through the first loop unit, and generate output from the combined result of the plurality of sources; and
    a control signal feed unit to supply a control signal to control the operation of the plurality of transistors, wherein
    the plurality of sources are input to the plurality of transistors in identical pattern if the control signal is supplied in a thermometer code manner, while the plurality of sources are input in different patterns for each of the transistors if the control signal is supplied in a multi-bits code manner.

2. The DAC of claim 1, wherein the plurality of sources comprise at least one of electric current, voltage, and power.

3. The DAC of claim 1, wherein the first loop unit comprises a plurality of sub-loop units constructed by the primary windings formed on a first side of the first loop unit, and a pair of transistors formed on a second side of the first loop unit.

* * * * *